United States Patent
Tang et al.

(10) Patent No.: US 11,211,429 B2
(45) Date of Patent: Dec. 28, 2021

(54) VERTICAL INTERCALATION DEVICE FOR NEUROMORPHIC COMPUTING

(71) Applicant: International Business Machines Corporation, Armonk, NY (US)

(72) Inventors: Jianshi Tang, Elmsford, NY (US); Takashi Ando, Tuckahoe, NY (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 16/285,318

(22) Filed: Feb. 26, 2019

(65) Prior Publication Data

US 2020/0273911 A1    Aug. 27, 2020

(51) Int. Cl.
*H01L 47/00*     (2006.01)
*H01L 27/24*     (2006.01)
*H01L 45/00*     (2006.01)

(52) U.S. Cl.
CPC ........ *H01L 27/2454* (2013.01); *H01L 45/085* (2013.01); *H01L 45/1206* (2013.01);
(Continued)

(58) Field of Classification Search
CPC .. G11C 5/02; G11C 5/063; G11C 8/14; G11C 13/0007; G11C 13/0028;
(Continued)

(56) References Cited

U.S. PATENT DOCUMENTS 8,027,188 B2 *  9/2011  Nagashima ............ G11C 5/02
                                                    365/113
8,058,643 B2   11/2011  Meyer et al.
(Continued)

FOREIGN PATENT DOCUMENTS

WO       2018004588      1/2018

OTHER PUBLICATIONS

Chen et al., "SiO2 based conductive bridging random access memory," Journal of Electroceramics 39 (2017) pp. 109-131.*
(Continued)

*Primary Examiner* — Jay C Kim
(74) *Attorney, Agent, or Firm* — Fleit Intellectual Property Law; Jon Gibbons

(57) ABSTRACT

Vertically stacked memory devices and methods of manufacture are provided. The structures include a substrate stack including a first row of horizontal electrodes disposed over a first insulating layer and first insulating layer disposed over a substrate. The substrate stack further includes a second row of horizontal electrodes separated from the first row of horizontal electrodes by a second insulating layer, and the first row of horizontal electrodes is form over and substantially parallel to the second row of horizontal electrodes. A third insulating layer is formed over the second row of horizontal electrodes. A plurality of vertical gate trenches formed through the third insulating layer, the second row of horizontal electrodes, the second insulating layer, the first row of horizontal electrodes and the first insulating layer. The plurality of vertical gate trenches filled with a layer of channel material, a layer of electrolyte material and filled with a metal.

14 Claims, 9 Drawing Sheets

(52) U.S. Cl.
CPC .......... *H01L 45/1253* (2013.01); *H01L 45/14* (2013.01); *H01L 45/1608* (2013.01)

(58) Field of Classification Search
CPC .............. H01L 27/2454; H01L 45/085; H01L 45/1206; H01L 45/1253; H01L 45/14; H01L 45/1608
See application file for complete search history.

(56) References Cited

U.S. PATENT DOCUMENTS

| | | | |
|---|---|---|---|
| 8,084,807 B2 * | 12/2011 | Ishiduki | H01L 27/11565 257/315 |
| 8,208,279 B2 * | 6/2012 | Lue | H01L 27/0688 365/148 |
| 8,941,089 B2 | 1/2015 | Gopalan et al. | |
| 9,130,054 B2 * | 9/2015 | Jang | H01L 29/511 |
| 9,153,705 B2 * | 10/2015 | Zhang | H01L 29/7827 |
| 9,514,807 B2 * | 12/2016 | Kang | G11C 13/0004 |
| 9,653,611 B2 * | 5/2017 | Atsumi | G11C 11/4085 |
| 9,768,180 B1 * | 9/2017 | Zhou | H01L 27/11582 |
| 9,773,802 B2 | 9/2017 | Wenxu et al. | |
| 10,103,165 B2 * | 10/2018 | Son | H01L 23/5283 |
| 10,109,680 B1 * | 10/2018 | Wicklein | H01L 27/249 |
| 10,114,590 B1 * | 10/2018 | Wicklein | G06F 3/0688 |
| 10,229,927 B2 * | 3/2019 | Lee | H01L 27/11582 |
| 10,283,708 B2 * | 5/2019 | Wu | H01L 27/1052 |
| 10,297,312 B1 * | 5/2019 | Futase | H01L 45/1253 |
| 10,312,288 B2 * | 6/2019 | Tada | H01L 27/105 |
| 2011/0129992 A1 * | 6/2011 | Jung | H01L 27/11578 438/587 |
| 2013/0248962 A1 | 9/2013 | Morota et al. | |
| 2017/0352750 A1 | 12/2017 | Lee et al. | |

OTHER PUBLICATIONS

Ma et al., "A Sputtered Silicon Oxide Electrolyte for High-Performance Thin-Film Transistors," Scientific Reports 809 (2017).*
Chen, W., Tappertzhofen, S., Barnaby, H. J., & Kozicki, M. N. (2017). SiO2 based conductive bridging random access memory. Journal of Electroceramics, 39(1-4), 109-131. 2017.

* cited by examiner

US 11,211,429 B2

VERTICAL INTERCALATION DEVICE FOR NEUROMORPHIC COMPUTING

BACKGROUND OF THE INVENTION

The invention relates to semiconductor structures and, more particularly, to non-volatile Electrochemical Random-Access Memory (ECRAM).

As describe in Wikipedia, neuromorphic computing, is a concept developed by Carver Mead, in the late 1980s, describing the use of very-large-scale integration (VLSI) systems containing electronic analog circuits to mimic neuro-biological architectures present in the nervous system. In recent times, the term neuromorphic has been used to describe analog, digital, mixed-mode analog/digital VLSI, and software systems that implement models of neural systems (for perception, motor control, or multisensory integration). The implementation of neuromorphic computing on the hardware level can be realized by oxide-based memristors, spintronic memories, threshold switches, and transistors.

Non-volatile Electrochemical Random-Access Memory (ECRAM) based on lithium (Li) or oxygen (O) ion intercalation in tungsten trioxide ($WO_3$) has been recently demonstrated as artificial synapse for neuromorphic computing. In fabrication of ECRAM devices, certain electrolytes, such as lithium phosphorus oxynitride (LiPON) or other Li-based electrolytes, are sensitive to exposure in air or humidity. Therefore the ECRAM device needs to be encapsulated to prevent degradation of these Li-based electrolytes.

SUMMARY OF THE INVENTION

Disclosed is a vertical ECRAM fabricated inside a trench, whose benefits, compared to conventional ECRAM, are saving device area and also encapsulating the electrolyte. The fabricated process may be extended to make arrays of 3D vertically stacked ECRAMs to further increase the packing density.

In one example or embodiment, a method for fabricating a vertically stacked memory devices is disclosed. The method comprises receiving a substrate stack including a first row of horizontal electrodes disposed over a first insulating layer. The first insulating layer is disposed over a substrate. A second row of horizontal electrodes is separated from the first row of horizontal electrodes by a second insulating layer. The first row of horizontal electrodes is formed over and substantially parallel to the second row of horizontal electrodes. A third insulating layer is deposited over the second row of horizontal electrodes. A mask is used over the third insulating layer to expose a portion thereof. Etching, as defined by a mask, is used to define a set of vertical gate trenches. The etching includes removing a portion of the third insulating layer, the second row of horizontal electrodes, the second insulating layer, the first row of horizontal electrodes and the first insulating layer, thereby forming a set of vertical gate trenches. A layer of channel material and then a layer of electrolyte material are conformally deposited. The vertical gate trenches are filled with a metal. Planarization is used to remove the metal, the layer of electrolyte material and the channel material formed above the set of vertical gate trenches. A gate dielectric is deposited to encapsulate the layer of the electrolyte material inside the set of vertical gate trenches.

In another embodiment, an integrated circuit is disclosed. The integrated circuit comprises a semiconductor structure with a substrate stack including a first row of horizontal electrodes disposed over a first insulating layer disposed and first insulating layer over a substrate. The semiconductor structure includes a second row of horizontal electrodes separated from the first row of horizontal electrodes by a second insulating layer, and the first row of horizontal electrodes is formed over and substantially parallel to the second row of horizontal electrodes. The semiconductor structure includes a third insulating layer formed over the second row of horizontal electrodes. A plurality of vertical gate trenches are formed through the third insulating layer, the second row of horizontal electrodes, the second insulating layer, the first row of horizontal electrodes and the first insulating layer, and the plurality of vertical gate trenches filled with a layer of channel material, a layer of electrolyte material; and filled with a metal.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

It is to be understood that the present disclosure will be described in terms of a given illustrative architecture; however, other architectures, structures, substrate materials, process features, and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference in the specification to "one embodiment" or "one example" or "an embodiment" or "an example" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Neuromorphic engineering is understanding how the morphology of individual neurons, circuits, applications, and overall architectures creates desirable computations, affects how information is represented, influences robustness to damage, incorporates learning and development, adapts to local change (plasticity), and facilitates evolutionary change.

Neuromorphic engineering is an interdisciplinary subject that takes inspiration from biology, physics, mathematics, computer science, and electronic engineering to design artificial neural systems, such as vision systems, head-eye systems, auditory processors, and autonomous robots, whose physical architecture and design principles are based on those of biological nervous systems.

In chemistry, intercalation is the reversible inclusion or insertion of a molecule (or ion) into materials with layered structures. Examples are found in graphite and transition metal dichalcogenides.

Figure 1:
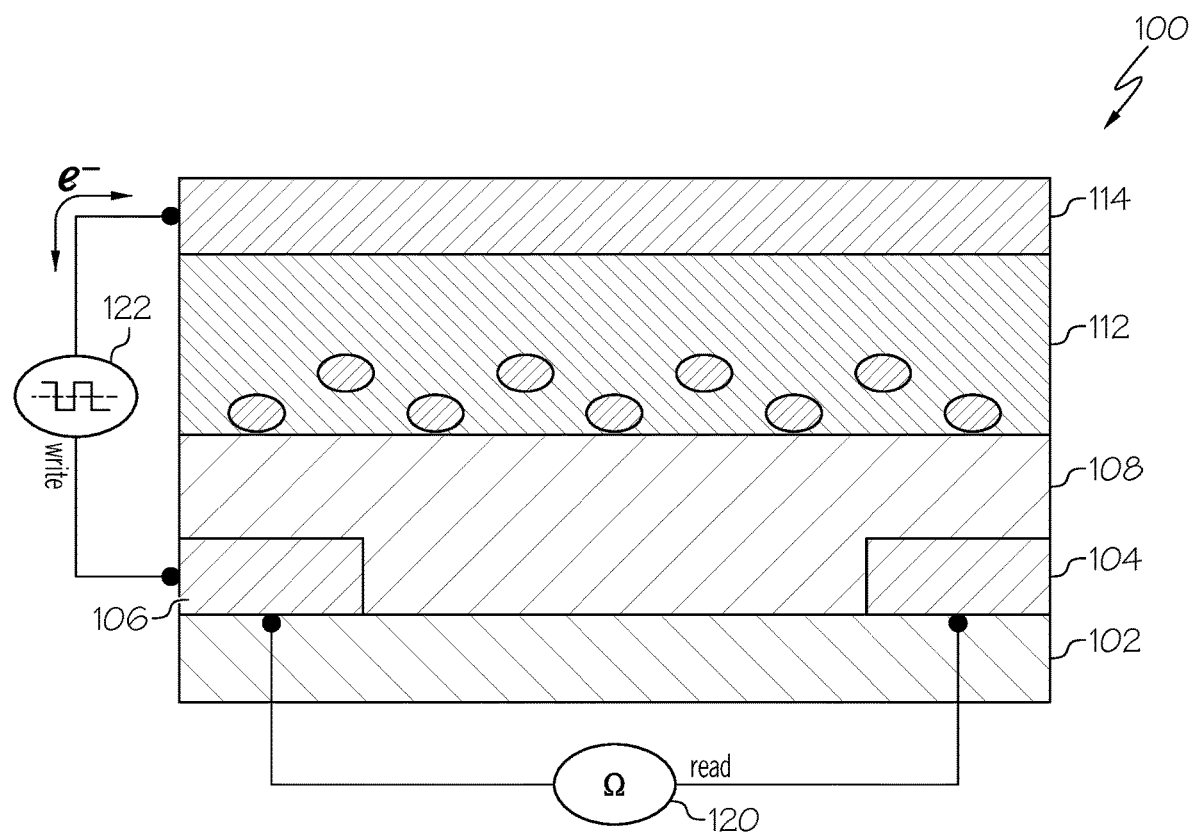
FIG. 1 is a prior art non-volatile Electrochemical Random-Access Memory (ECRAM)

Referring now to FIG. 1, shown is a prior art non-volatile Electrochemical Random-Access Memory (ECRAM) 100. Starting from the bottom layer shown is substrate 102 with a drain 104 and source 106 formed above it. A layer 108 of tungsten trioxide ($WO_3$) is formed over the substrate 102, the drain 104 and the source 106 as shown.

A layer of lithium-based electrolytes, in this example lithium phosphorus oxynitride (LiPON) 112, is formed on top of the tungsten trioxide ($WO_3$) 108 layer. A gate or reservoir layer 114 is formed on top of the LiPON 112 layer as shown. A logical value is written by applying a voltage 122 across the gate 114 and the source 106. A logical value 120 is read by measuring the resistance across the source 106 and the drain 104.

In the fabrication of such ECRAM devices, certain electrolytes, lithium phosphorus oxynitride (LiPON) or other Li-based electrolytes are sensitive to exposure in air or humidity; therefore the device needs to be encapsulated to prevent degradation.

The vertically stacked devices of the present invention may be manufactured in a number of ways using a number of different tools. In general, though, the methodologies and tools are used to form structures with dimensions in the micrometer and nanometer scale. The methodologies, i.e., technologies, employed to manufacture the vertically stacked memory devices of the present invention have been adopted from integrated circuit (IC) technology. For example, the structures of the present invention are built on wafers and are realized in films of material patterned by photolithographic processes on the top of a wafer. In particular, the fabrication of the vertically stacked memory devices of the present invention uses four basic building blocks: (i) deposition of thin films of material on a substrate, (ii) applying a patterned mask on top of the films by photolithographic imaging, (iii) etching the films selectively to the mask, and (iv). modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer; examples include etch processes (either wet or dry) and chemical-mechanical planarization (CMP).

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

The present disclosure may include a design for an integrated circuit chip that may be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
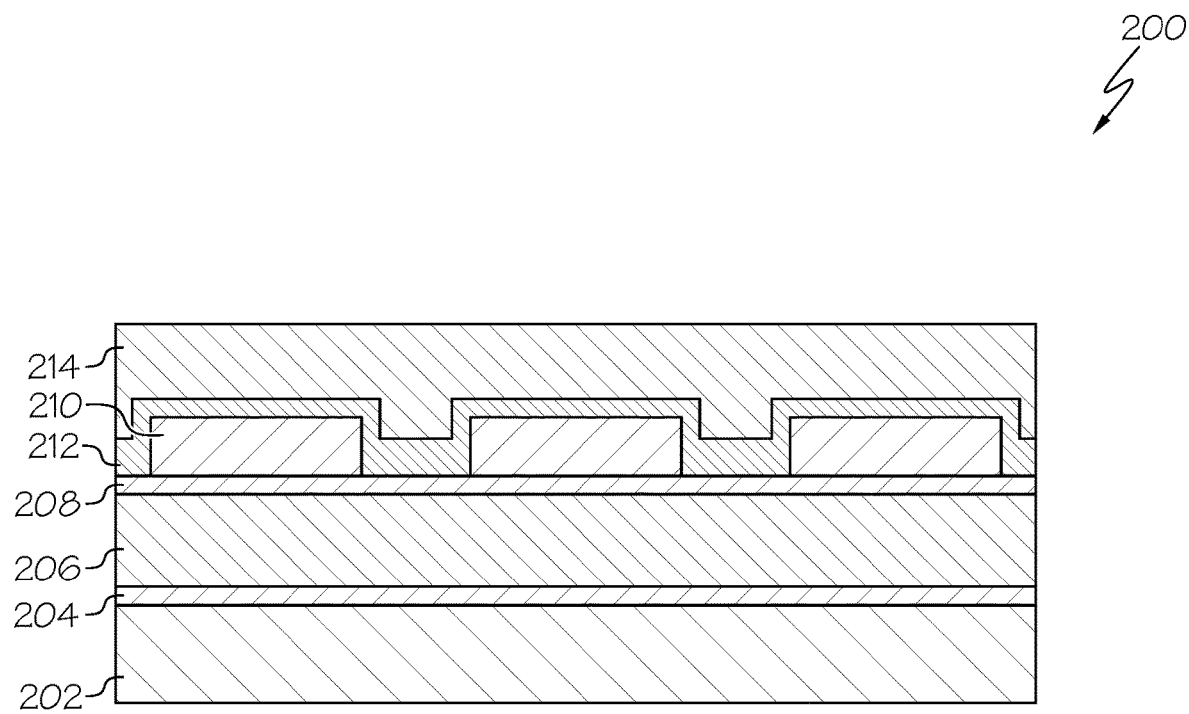
FIG. 2 is a cross-sectional view of one example of the first major process step in the overall process illustrating deposition for creating a first row of horizontal electrodes.

FIG. 2 is a cross-sectional view 200 of one example of the first major process step in the overall process illustrating deposition for creating a first row of horizontal electrodes. Shown is a substrate 202. The substrate 202, in one example, may be a non-porous silicon (Si)-based substrate, a single-crystal non-porous Si substrate, and/or the like. The substrate 202 may have a vertical thickness ranging from 25 μm to 5000 μm although other thicknesses are applicable as well.

Disposed on top of the substrate 202 is a first electronic insulating material 204. The insulating material may be a single material. Examples of materials that are suitable for use as the first electronic insulating material 204 includes silicon nitride (SiN). A first ionic insulating layer 206 is formed over the electronic insulating layer 204. The ionic insulating material may be silicon dioxide (SiO2) 206 as shown. A second electronic insulating layer 208 is deposited over the first ionic insulating layer 206. The first electronic insulating layer 204 may have a thickness from 1 nm to 10 nm and the first ionic insulating layer 206 may have a thickness from 10 nm to 100 nm although other thicknesses are applicable as well. The disposition of layers 204 and 206 can by conventional deposition processes including chemical vapor deposition (CVD), atomic layer deposition (ALD).

Next a first row of horizontal electrodes 210 is deposited and patterned using photolithographic masks. The first row of horizontal electrodes 210 may be formed using conventional deposition processes, e.g., physical vapor deposition (PVD), followed by lithographic process composed by a resist mask, anti-reflective coating such as Siarc and a OPL and etching, e.g., Reactive Ion Etching (RIE), wet etching or processes known to those of ordinary skill in the art such that further description is not required for an understanding of the invention. The first row of horizontal electrodes 210 is then patterned. The first row of horizontal electrodes 210 can be formed from titanium nitride (TiN), tantalum nitride (TaN), tungsten (W), or a combination. A sufficient thickness must be maintained to provide both electrical and ionic insulating properties after the logical value is written. The first row of horizontal electrodes 210 may have a thickness from 10 nm to 100 nm although other thicknesses are applicable as well.

Figure 3:
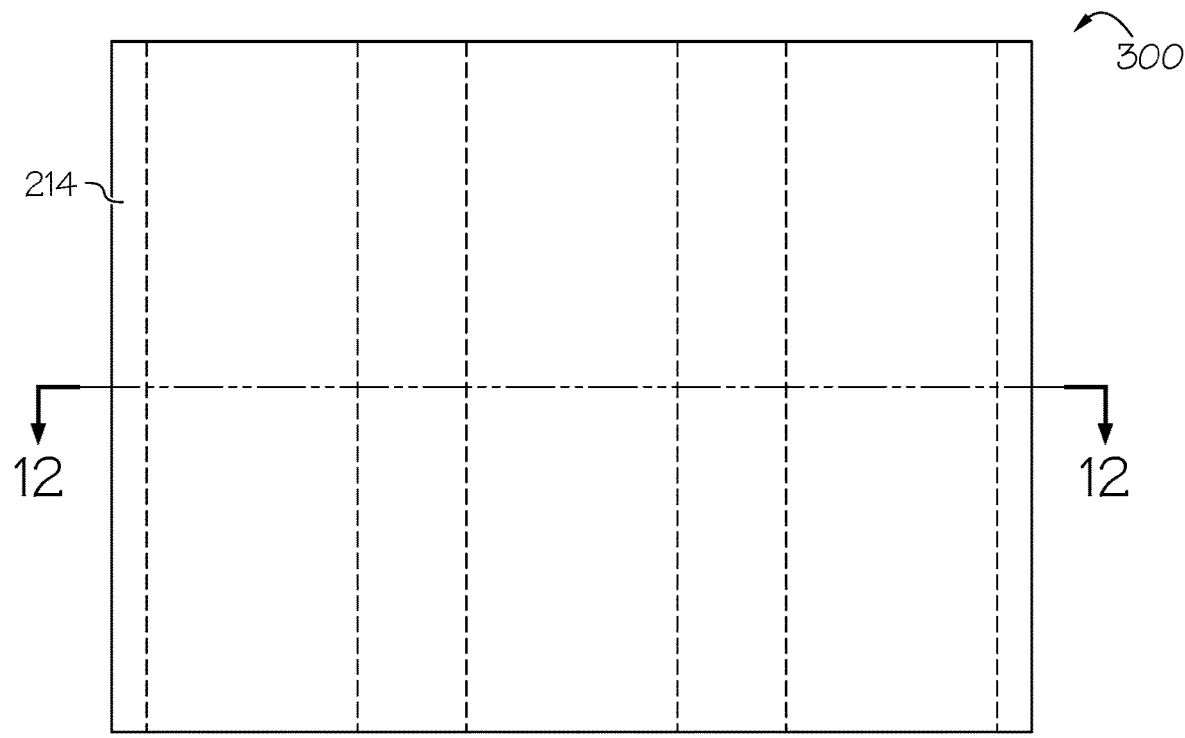
FIG. 3 is a top-down view of FIG. 2.
Figure 4:
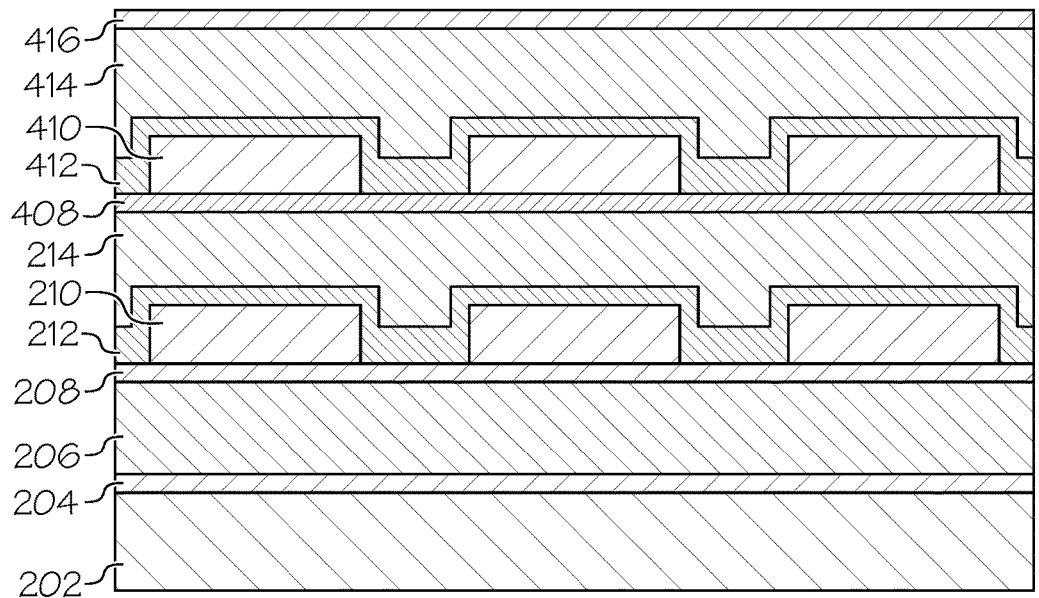
FIG. 4 is a cross-sectional view of one example of the second major process step in the overall process illustrating deposition for creating a second row of horizontal electrodes.

A third electronic insulating layer 212 is conformally deposited over the first row of horizontal electrodes 210 and any exposed the second electronic insulating layer 208. Examples of materials that are suitable for use as the third electronic insulating material 212 includes silicon nitride (SiN). A second ionic insulating layer 214 is formed over the third electronic insulating layer 212. The second ionic insulating material may be silicon dioxide (SiO2) 214 as shown. FIG. 3 is a top-down view of FIG. 2. The second electronic insulating layer 204 may have a thickness from 1 nm to 10 nm and the second ionic insulating layer 206 may have a thickness from 10 nm to 100 nm although other thicknesses are applicable as well. The disposition of layers 212 and 214 can by conventional deposition processes including chemical vapor deposition (CVD), FIG. 4 is a cross-sectional view 400 of one example of the second major process step in the overall process illustrating deposition for creating a second row of horizontal electrodes. A fourth electronic insulating layer 408 is deposited over the second ionic insulating layer 214. Next a second row of horizontal electrodes 410 is deposited and patterned using photolithographic masks. The second row of horizontal electrodes 410 may be formed using conventional deposition processes, e.g., physical vapor deposition (PVD), followed by lithographic process composed by a resist mask, anti-reflective coating such as Siarc and a OPL and etching, e.g., Reactive Ion Etching (RIE), wet etching or processes known to those of ordinary skill in the art such that further description is not required for an understanding of the invention. The second row of horizontal electrodes 410 is then patterned. The second row of horizontal electrodes 410 is formed substantially parallel to the first row of horizontal electrodes 210. A sufficient thickness must be maintained to provide both electrical and ionic insulating properties after the logical value is written. The second row of horizontal electrodes 410 can be formed from titanium nitride (TiN), tantalum nitride (TaN), tungsten (W), or a combination. A sufficient thickness must be maintained to provide both electrical and ionic insulating properties after the logical value is written. The second row of horizontal electrodes 210 may have a thickness from 10 nm to 100 nm although other thicknesses are applicable as well. The first row of horizontal electrodes 210 and the second row of horizontal electrodes 410 can be the same thickness for both or defined as two different thicknesses.

Figure 5:
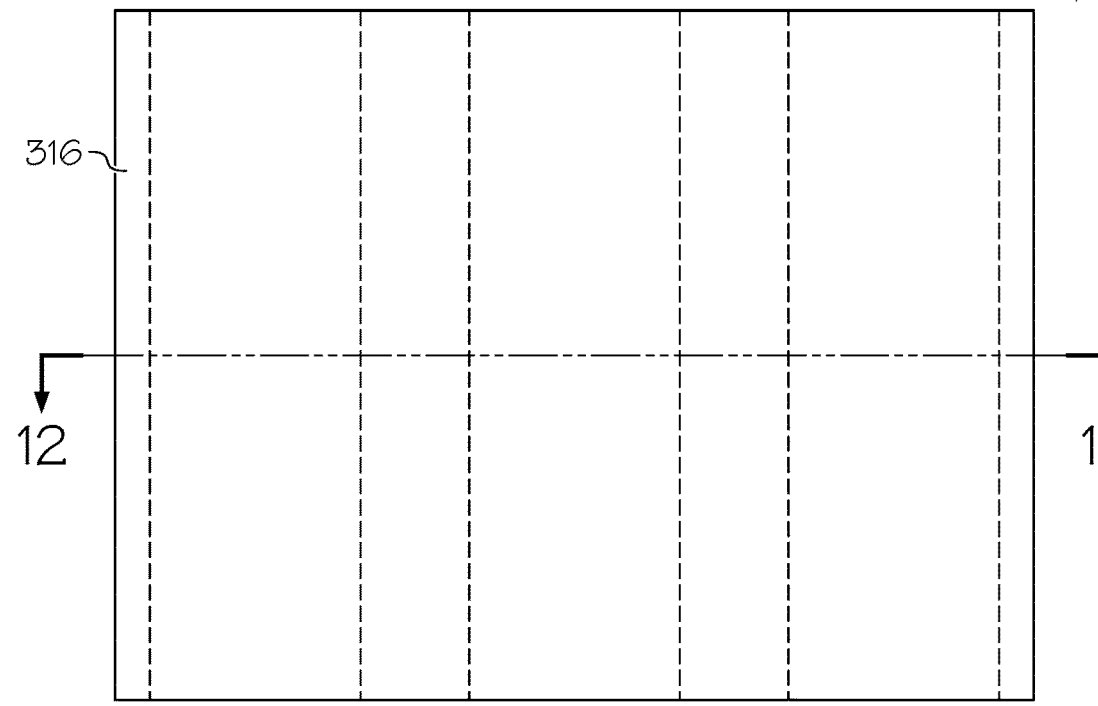
FIG. 5 is a top-down view of FIG. 4.

A fifth electronic insulating layer 412 is conformally deposited over the second row of horizontal electrodes 410 and any exposed the second electronic insulating layer 408. Examples of materials that are suitable for use as the fifth electronic insulating material 412 includes silicon nitride (SiN). A third ionic insulating layer 414 is conformally formed over the fifth electronic insulating layer 412. The third ionic insulating material may be silicon dioxide (SiO2) 414 as shown. A sixth electronic insulating layer 416 formed over the third ionic insulating layer 414. FIG. 5 is a top-down view of FIG. 4. A sixth electronic insulating layer 416 includes silicon nitride (SiN) is used as a chemical-mechanical planarization (CMP) stopping layer. The disposition of layers 416 can by conventional deposition processes including chemical vapor deposition (CVD).

Figure 6:
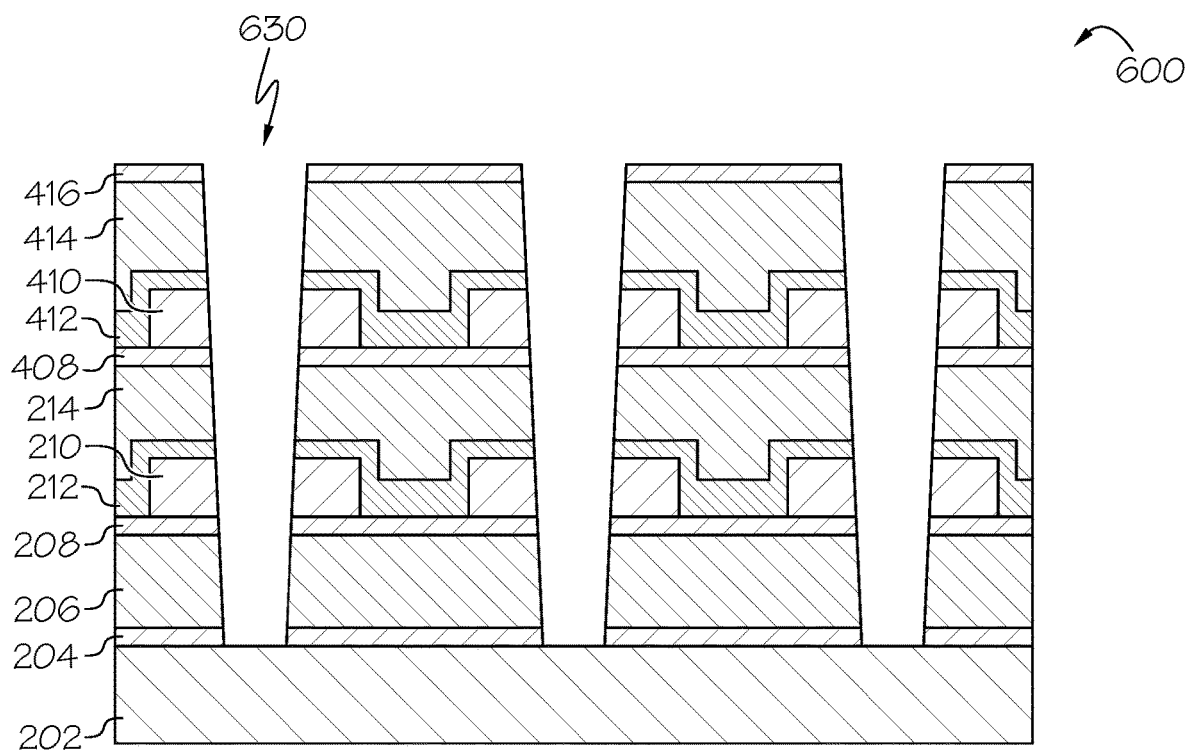
FIG. 6 is a cross-sectional view of one example of the third major process step in the overall process illustrating forming a trench.
Figure 7:
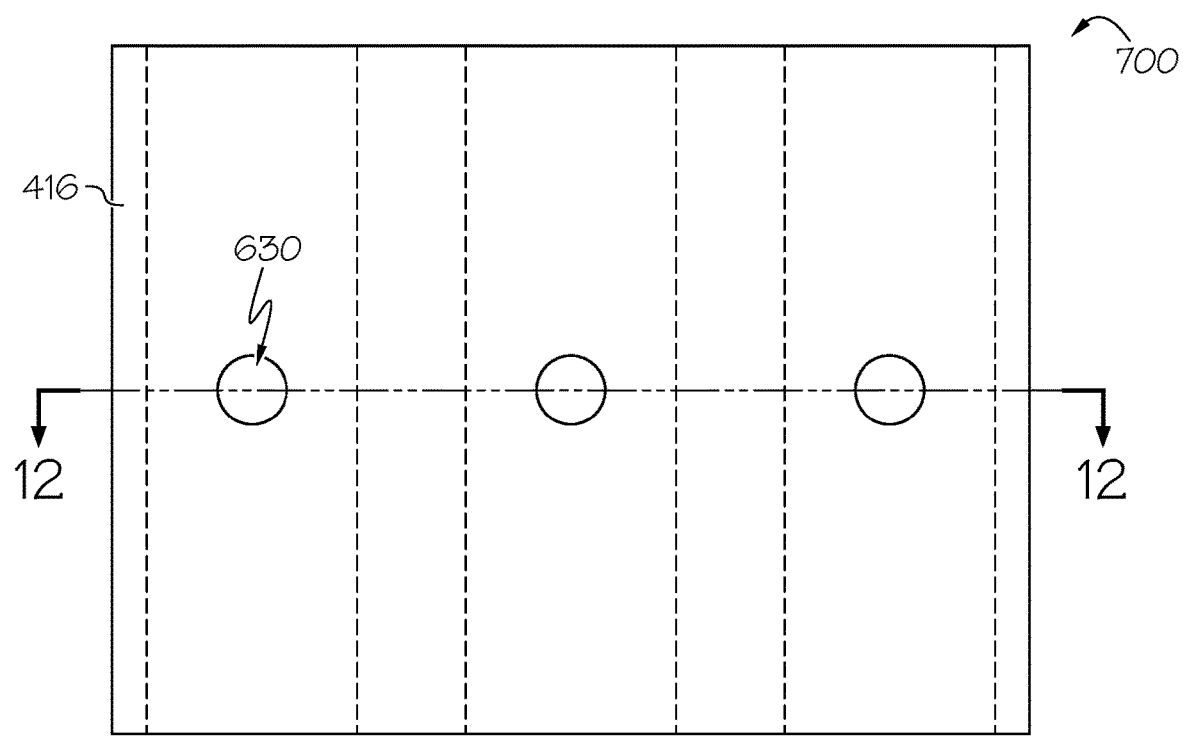
FIG. 7 is a top-down view of FIG. 6.

FIG. 6 is a cross-sectional view 600 of one example of the third major process step in the overall process illustrating forming a trench 630. FIG. 7 is a top-down view of FIG. 6. The trench 630 is formed using a patterning process. The trench 630 exposes—from the top to the bottom—at least a portion of
    the sixth electronic insulating layer 416,
    the third ionic insulating layer 414,
    the fifth electronic insulating layer 412,
    the second row of horizontal electrodes 410,
    the fourth electronic insulating layer 408,
    the second ionic insulating layer 214,
    the third electronic insulating layer 212,
    the first row of horizontal electrodes 210,
    the second electronic insulating layer 208,
    the first ionic insulating layer 206, and
    the first electronic insulating layer 204.

In one or more examples, the set of vertical gate trenches 630 are formed by conventional lithography and etching processes. For example, a resist may be formed over the hard mask (not shown), which is exposed to energy (light) to form a pattern (openings). A reactive ion etching (RIE) process may then be performed through the openings of the resist to form the openings in the hard mask. The resist may then be removed using conventional stripants or oxygen ashing processes.

Figure 8:
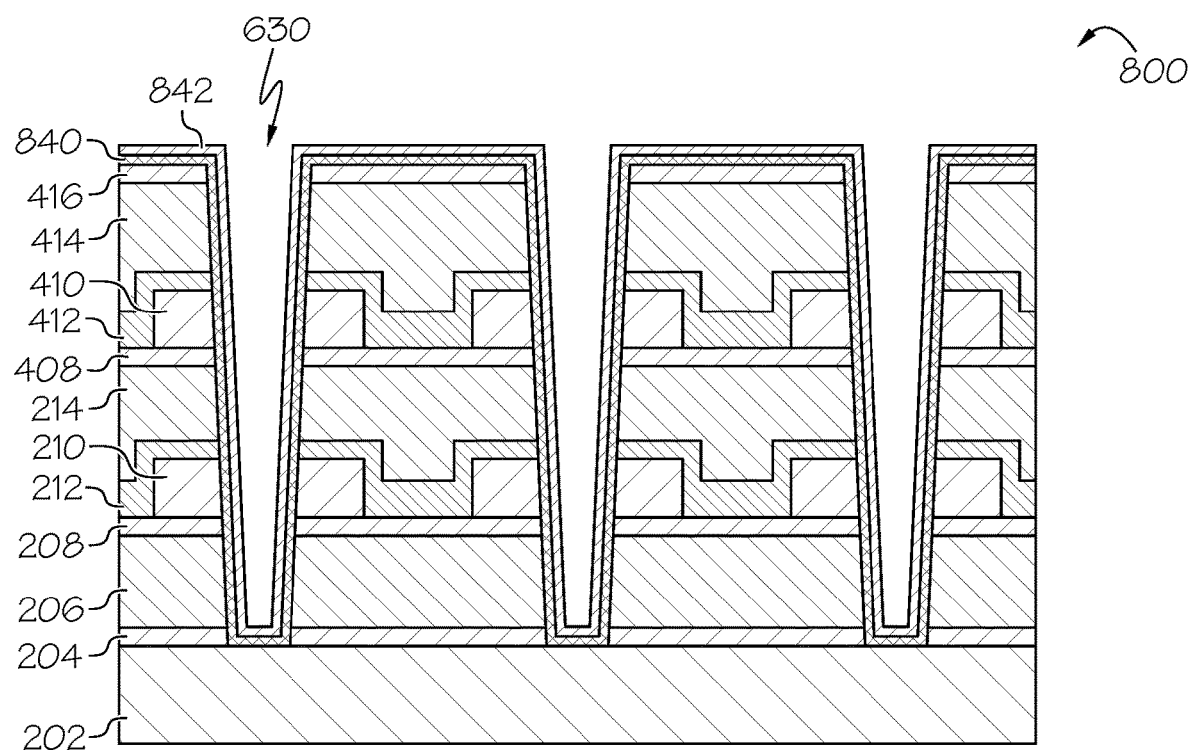
FIG. 8 is a cross-sectional view of one example of the fourth major process step in the overall process illustrating deposition for creating a gate stack or channel.
Figure 9:
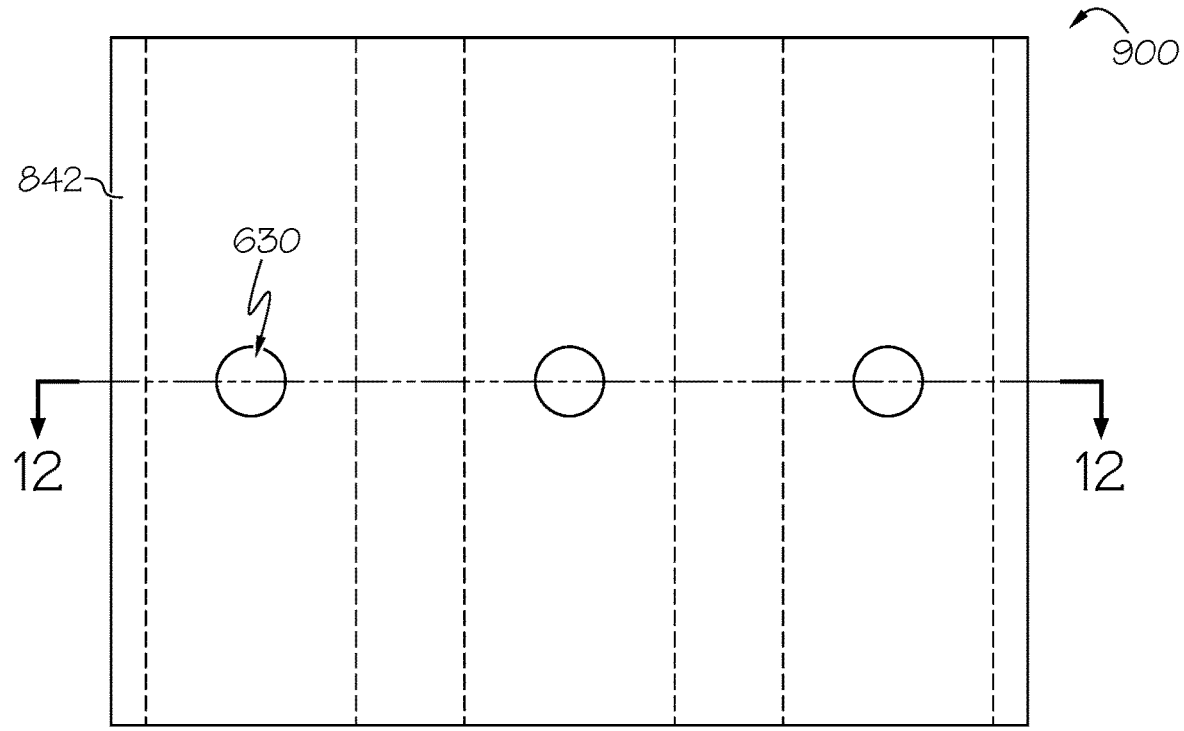
FIG. 9 is a top-down view of FIG. 8.

FIG. 8 is a cross-sectional view of one example of the fourth major process step in the overall process illustrating deposition for creating a gate stack or channel. Two layers are deposited inside the trench 630 and over the sixth electronic insulating layer 416. The gate stack includes a first layer 840 comprising tungsten trioxide ($WO_3$) followed by a second layer 842 comprising lithium phosphorus oxynitride (LiPON). The first layer 840 may contact a top surface of the sixth electronic insulating layer 416; sidewalls of the various layers and electrodes identified above that have been exposed by the trench 630; and a top surface of the substrate 202 exposed by the trench 630. The second layer 842 may be formed in contact with and conforming to the first layer 840. FIG. 9 is a top-down view of FIG. 8. The sixth insulating layer 416 may have a thickness from 10 nm to 100 nm although other thicknesses are applicable as well.

Figure 10:
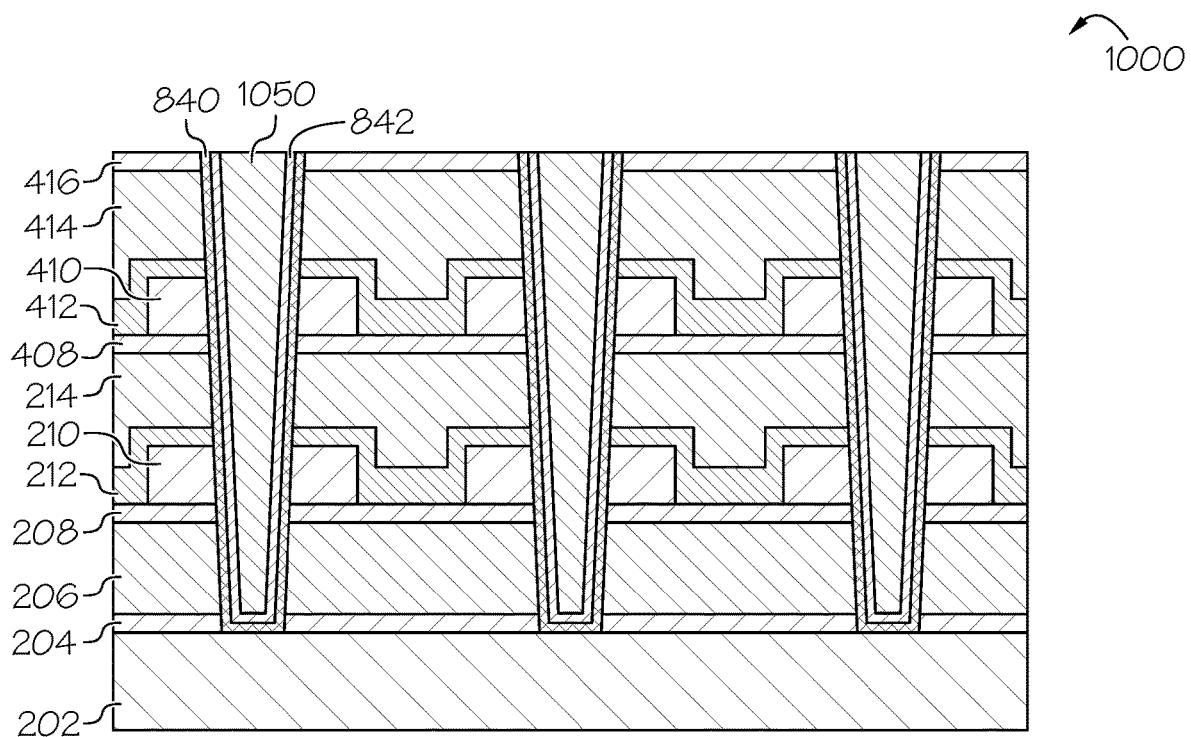
FIG. 10 is a cross-sectional view of one example of the fifth major process step in the overall process illustrating metal fill.
Figure 11:
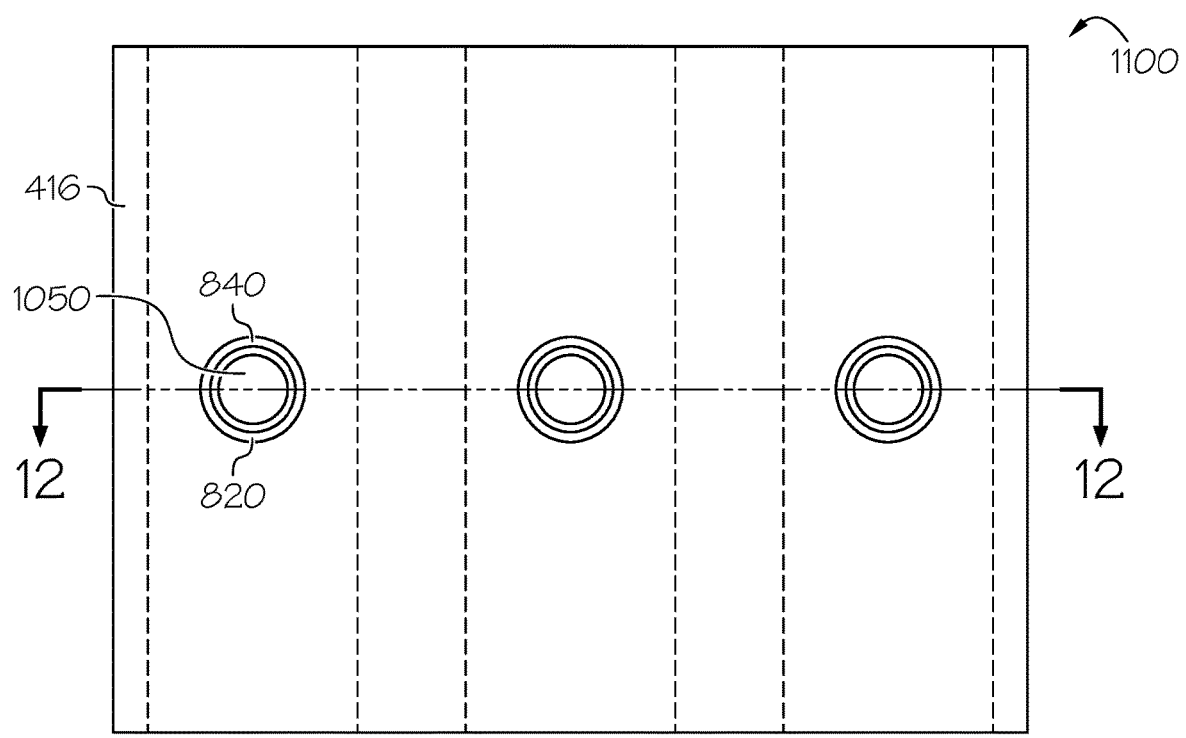
FIG. 11 is a top-down view of FIG. 10.

FIG. 10 is a cross-sectional view of one example of the fifth major process step in the overall process illustrating metal fill 1050. The metal fill 1050 can be titanium nitride (TiN) or tungsten (W). FIG. 11 is a top-down view of FIG. 10. A chemical-mechanical planarization (CMP) is used to remove the metal fill 1050, the first layer 840 and the second layer 842 above the gate stack to the sixth insulating layer 416.

Figure 12:
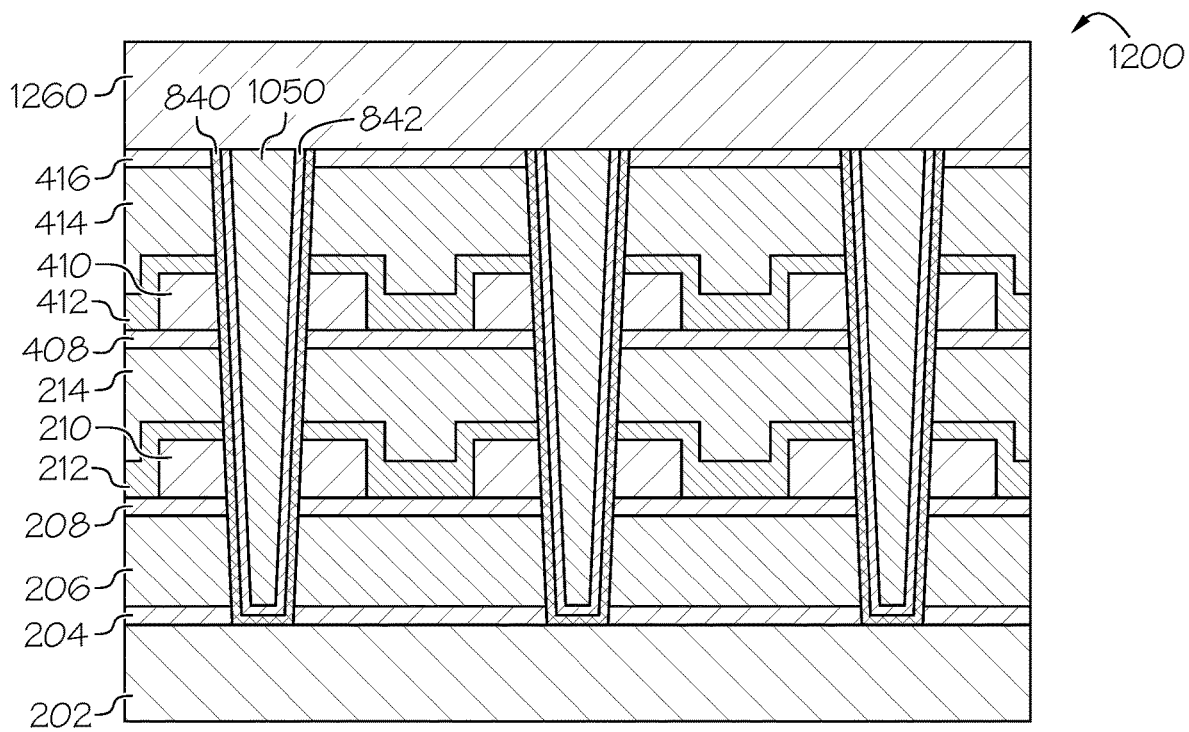
FIG. 12 is a cross-sectional view of one example of the sixth major process step in the overall process illustrating deposition for dielectric passivation.
Figure 13:
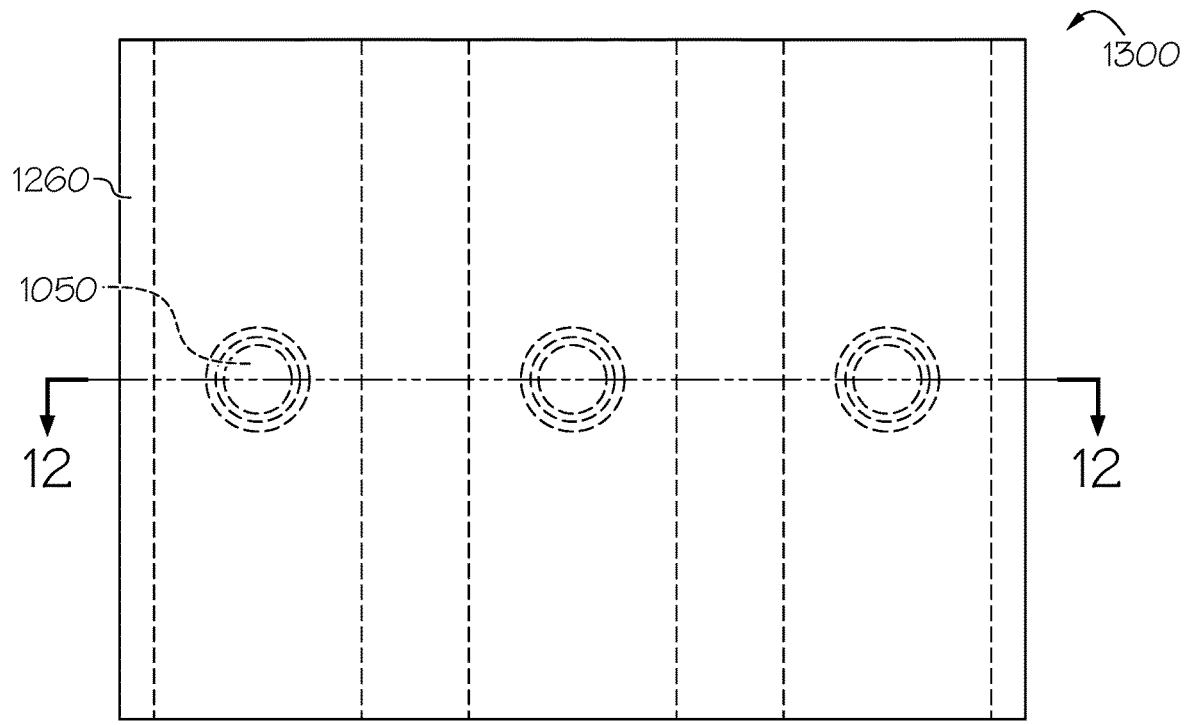
FIG. 13 is a top-down view of FIG. 12.

FIG. 12 is a cross-sectional view of one example of the sixth major process step in the overall process illustrating deposition for dielectric passivation. Example of dielectrics 1470 include silicon nitride ($Si_3N_4$), silicon dioxide ($SiO_2$). FIG. 13 is a top-down view of FIG. 12. The dielectric passivation layer encapsulates the trench 630 including layer 840 of tungsten trioxide ($WO_3$) and the layer 842 of lithium phosphorus oxynitride (LiPON). This encapsulation prevents degradation of the Li-based electrolyte.

Figure 14:
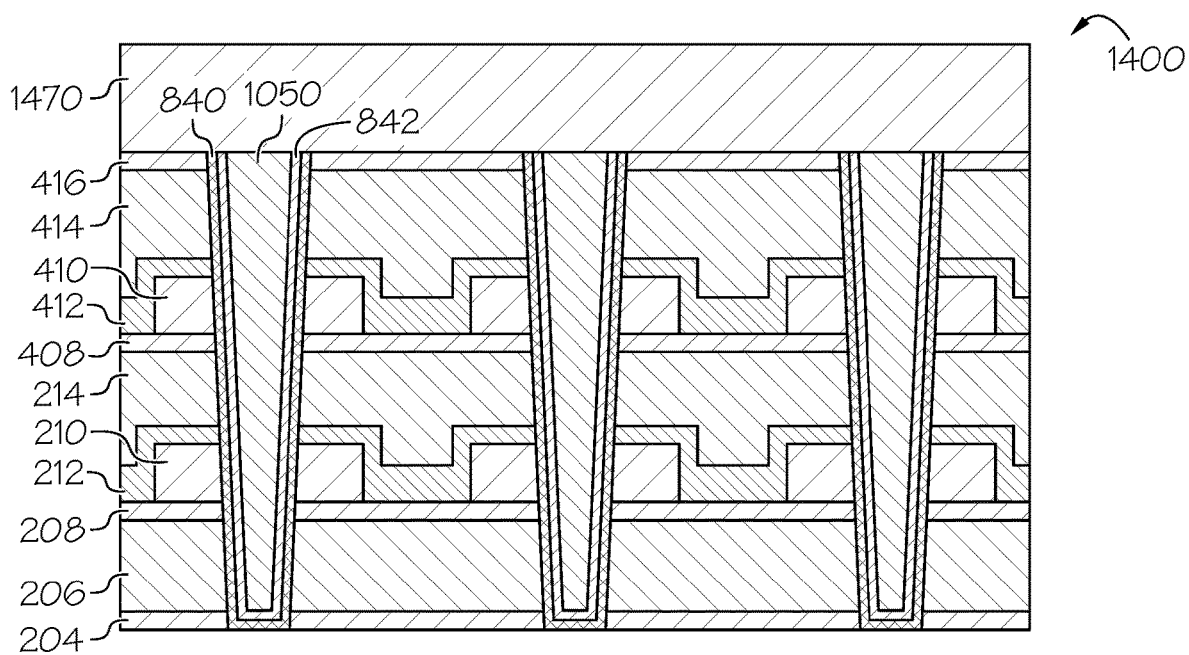
FIG. 14 is another cross-sectional view of one example FIG. 12 but on the same drawing sheet as FIG. 15.
Figure 15:
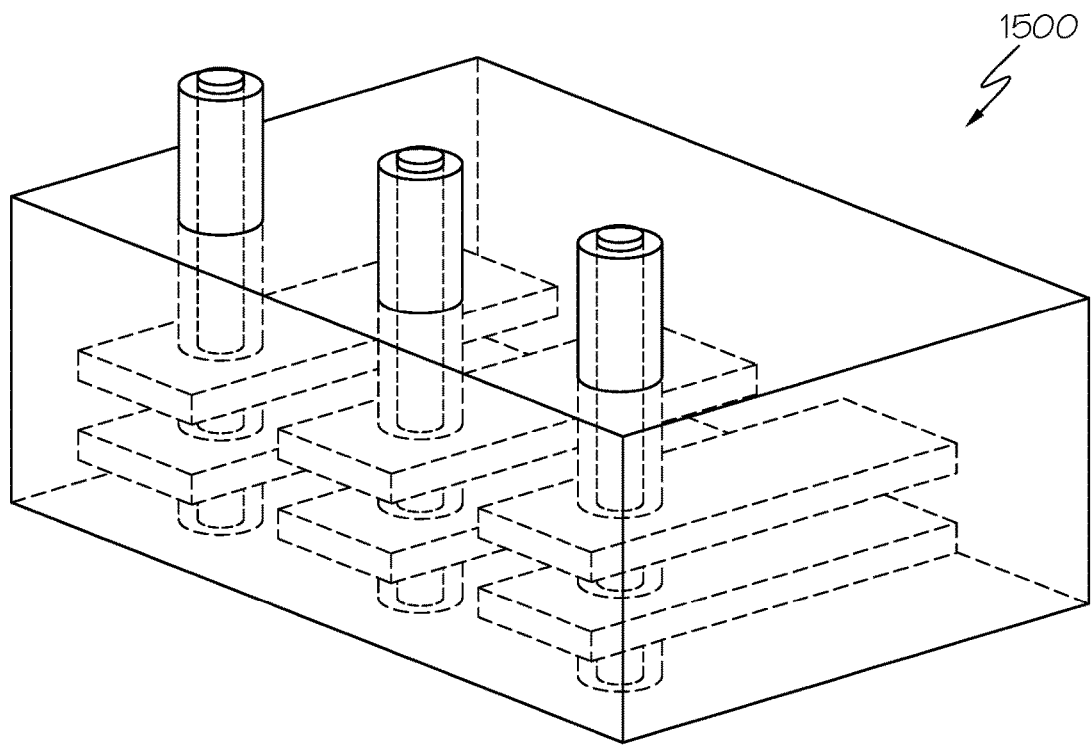
FIG. 15 is a side perspective view of FIG. 14.

FIG. 14 is another cross-sectional view of one example FIG. 12 but on the same drawing sheet as perspective view of FIG. 15. FIG. 15 is a side perspective view showing the first row of horizontal electrodes 210, the second row of electrodes 410 and the vertical gate 1050.

Figure 16:
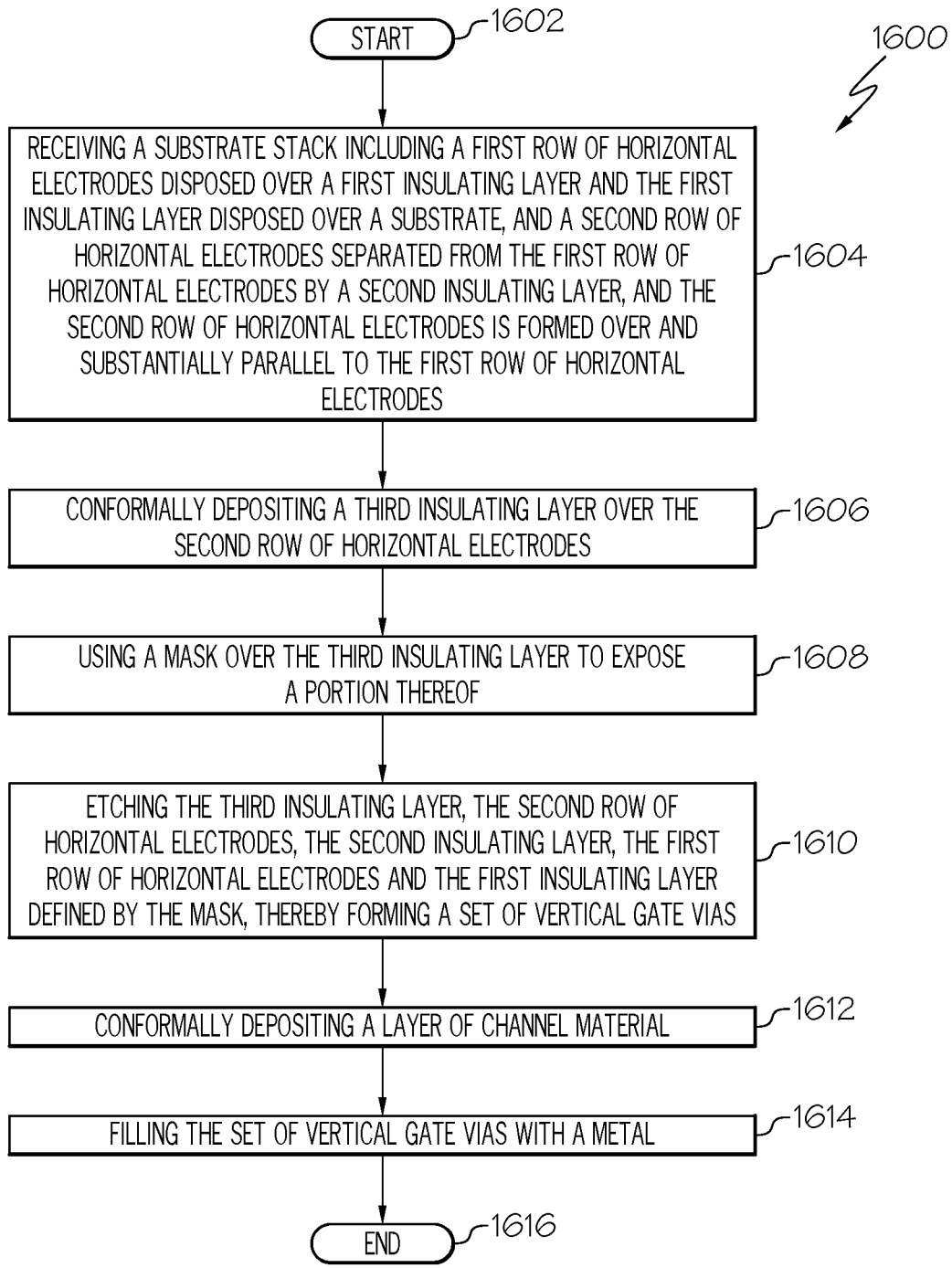
FIG. 16 is a flow chart depicting a method for forming a vertical intercalation device in accordance with at least one embodiment of the present invention.

FIG. 16 is a flow chart depicting a method for forming a vertical intercalation device in accordance with at least one embodiment of the present invention. As illustrated, the method starts at step 1602 and immediately proceeds to step 1604 in which a substrate stack is received, e.g. 400 of FIG. 4. The substrate stack 400 is formed using the process described above. The process stack includes a substrate stack 202 including a first row of horizontal electrodes 210 disposed over a first insulating layer 206 and the first insulating layer disposed over a substrate 202, and a second row of horizontal electrodes 410 separated from the first row of horizontal electrodes 210 by a second insulating layer 214, and the second row of horizontal electrodes 410 is formed over and substantially parallel to the first row of horizontal electrodes 210.

The process continues to step 1606, in which a third insulating layer 414 is conformally deposited over the second row 410 of horizontal electrodes. The process continues to step 1608.

It is important to note that other insulating layers are shown in FIG. 400, such as layers 204, 208, 212, 408, 412, and 416. These layers could be electronic insulating layers. In contrast the layers 206, 214, and 414 may be ionic insulating layers or vice-versa.

In step 1608, using a mask is used on the third insulating layer 414 to expose a portion thereof. The process continues to step 1610 for etching. Wet or dry etching is used to formed a set of vertical gate trenches 630. The vertical gate trenches 630 are formed by etching portions of the second row of horizontal electrodes 410, the second insulating layer 214, the first row of horizontal electrodes 210 and the first insulating layer 206. The process continues to step 1612.

In step 1612 a layer of channel material 840 followed by a layer of electrolyte material 842 are conformally deposited. Next, in step 1614 the vertical gate trenches are filled with a metal 1050. The process continues to step 1616.

In step 1616, the metal 1050, the layer of electrolyte material 842 and the layer of channel material 840 are removed, by planarization, from above the set of vertical gate trenches as shown in FIG. 10. The process continues to step 1618.

In step 1618 dielectric passivation is performed to encapsulate the gate trenches and the process ends in step 1620.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for fabricating a vertically stacked memory device, the method comprising:
  forming a stack by
    depositing a second electronic insulating layer over a first ionic layer, the first ionic layer disposed over a first electronic insulating layer, and the first electronic insulating layer disposed over a substrate;

depositing a first electrode layer;

patterning the first electrode layer into a first row of horizontal electrodes over the second electronic insulating layer, wherein the first row of horizontal electrodes is formed of titanium nitride (TiN), tantalum nitride (TaN), tungsten (W), or a combination thereof;

depositing a fourth electronic insulating layer over a second ionic layer, the second ionic layer disposed over a third electronic insulating layer, the third electronic insulating layer disposed over the first row of horizontal electrodes;

depositing a second electrode layer;

patterning the second electrode layer into a second row of horizontal electrodes over the fourth electronic insulating layer, wherein the second row of horizontal electrodes is formed of titanium nitride (TiN), tantalum nitride (TaN), tungsten (W), or a combination thereof;

depositing a sixth electronic insulating layer over a third ionic layer disposed over a fifth electronic insulating layer disposed over the second row of horizontal electrodes;

forming a set of vertical gate trenches in the stack;

conformally depositing a layer of channel material in the set of vertical gate trenches;

conformally depositing a layer of electrolyte material in contact with the layer of channel material, wherein the layer of electrolyte material comprises one of lithium ion, hydrogen ion, and oxygen ion, which is intercalated in a tungsten trioxide ($WO_3$) of the layer of channel material; and filling the set of vertical gate trenches with a metal to form a vertical gate electrode on top of the layer of electrolyte material.

2. The method of claim 1, further comprising:

removing, by planarizing, the metal, the layer of channel material, and the layer of electrolyte material formed above the set of vertical gate trenches; and depositing a dielectric layer to encapsulate the electrolyte material inside the set of vertical gate trenches.

3. The method of claim 1, wherein the layer of electrolyte material forms part of the layer of channel material in an electrochemical random access memory (ECRAM).

4. The method of claim 1, wherein one or more of the first electronic insulating layer and the second electronic insulating layer is formed of silicon nitride (SiN).

5. The method of claim 4, wherein the third electronic insulating layer is formed of silicon nitride (SiN).

6. The method of claim 5, wherein the fifth electronic insulating layer is formed of silicon nitride (SiN).

7. The method of claim 6, wherein the sixth electronic insulating layer is formed of silicon nitride (SiN).

8. The method of claim 1, wherein the first ionic layer or the second ionic layer is formed of silicon dioxide (SiO2), or both are formed of silicon dioxide (SiO2).

9. The method of claim 1, wherein the third ionic layer is formed of silicon dioxide (SiO2).

10. The method of claim 1, wherein the first ionic layer or the second ionic layer has a thickness from 10 nm to 100 nm, or both the first ionic layer and the second ionic layer have a thickness from 10 nm to 100 nm.

11. The method of claim 1, wherein the third ionic layer has a thickness from 10 nm to 100 nm.

12. The method of claim 1, wherein the first row of horizontal electrodes has a thickness from 10 nm to 100 nm.

13. The method of claim 1, wherein the second row of horizontal electrodes has a thickness from 10 nm to 100 nm.

14. The method of claim 1, wherein one or more of the first electronic insulating layer, the second electronic insulating layer, the third electronic insulating layer, the fourth electronic insulating layer, the first electronic insulating layer, and the sixth electronic insulating layer has a thickness from 1 nm to 10 nm.

\* \* \* \* \*